(12) United States Patent
Ma et al.

(10) Patent No.: US 9,246,548 B2
(45) Date of Patent: Jan. 26, 2016

(54) ELECTROMAGNETIC COUPLING OF ELECTRONIC DEVICES USING RESONANT TERMINATIONS THAT SHIFT RESONANT FREQUENCIES

(71) Applicant: Sony Corporation, Tokyo (JP)

(72) Inventors: Yugang Ma, Singapore (SG); Kenichi Kawasaki, Tokyo (JP); Hisashi Masuda, Singapore (SG)

(73) Assignee: Sony Corporation, Tokyo (JP)

( * ) Notice: Subject to any disclaimer, the term of this patent is extended or adjusted under 35 U.S.C. 154(b) by 101 days.

(21) Appl. No.: 13/898,499

(22) Filed: May 21, 2013

(65) Prior Publication Data

US 2013/0314181 A1    Nov. 28, 2013

(30) Foreign Application Priority Data

May 28, 2012  (SG) .............................. 2012-03955-8

(51) Int. Cl.
*H04B 5/00* (2006.01)
*H03H 7/01* (2006.01)
*H04B 1/52* (2015.01)
*H01P 5/02* (2006.01)

(52) U.S. Cl.
CPC .............. *H04B 5/00* (2013.01); *H03H 7/0123* (2013.01); *H04B 1/52* (2013.01); *H01P 5/028* (2013.01)

(58) Field of Classification Search
CPC ........................................................ H04B 5/00
USPC .............................. 333/24 R, 24 C; 455/41.1
See application file for complete search history.

(56) References Cited

U.S. PATENT DOCUMENTS

| | | | |
|---|---|---|---|
| 6,317,011 B1 * | 11/2001 | Barnett et al. | 333/24 C |
| 6,891,447 B2 * | 5/2005 | Song | 333/24 R |
| 7,481,672 B2 | 1/2009 | Edvardsson | |
| 2009/0096556 A1 * | 4/2009 | Washiro | 333/24 R |
| 2011/0090030 A1 * | 4/2011 | Pagani | 333/24 R |
| 2011/0254643 A1 * | 10/2011 | Iida | 333/24 R |

* cited by examiner

*Primary Examiner* — Benny Lee
(74) *Attorney, Agent, or Firm* — Hazuki International, LLC

(57) ABSTRACT

An electromagnetic coupler comprising: a transmitter configured to operate at a first central frequency, a first termination configured to connect to the transmitter and having a second resonant frequency, a receiver configured to operate at the first frequency, a second termination configured to connect to the receiver and having a third resonant frequency, wherein when the first and second terminations are bought into close proximity when engaged, the equivalent resonant frequency is substantially the first frequency, and wherein the second and/or third frequencies being substantially spectrally spaced from the first frequency.

19 Claims, 4 Drawing Sheets

Resonant frequency shifting to prevent radiation leakage

ELECTROMAGNETIC COUPLING OF ELECTRONIC DEVICES USING RESONANT TERMINATIONS THAT SHIFT RESONANT FREQUENCIES

FIELD

The present disclosure relates to a coupler.

BACKGROUND

A connector or coupler is used for electrically connecting two devices so as to pass a signal. A connector may include a female metal contact on one side, which engages with a male metal contact on the other side. However, such connectors may suffer from the following problems:

1. The connection performance may degrade due to oxidation and wear after time.
2. When the data rate is ultra high (>10 Gb/s) the area of each contact becomes very small.
3. The small mechanical parts are very easily damaged.
4. The fabrication is expensive.

An alternative to metal connectors 1s a wireless signal connection. However, a wireless connection is less ideal due to electromagnetic interference (EMI) and limited frequency resource. A further promising alternative is a dielectric connector, for example U.S. Pat. No. 7,481,672. However, such prior art dielectric connectors are mainly useful for DC isolation and still suffer from EMI problems, especially in the unconnected state. EMI problems can relate to the device being overly susceptible to interference from other devices, and/or that the device causes excessive interference in other devices.

SUMMARY

In general terms the present embodiments propose a resonant electromagnetic (EM) coupler which does not radiate significantly in an unconnected state. This may have the advantages(s) that:

1. no metal contacts are required,
2. EMI may be substantially eliminated for both connected and disconnected state,
3. consistent performance over the device lifetime,
4. longer life-time,
5. water resistant,
6. wideband >10 GHz bandwidth @centre frequency 60 GHz (or relative bandwidth>16%) and hence much higher data rate (>10 Gb/s) can be achieved,
7. no radio frequency license needed,
8. safer data transmission because there is no radiation leakage to the environment, any information transmission is point-to-point. Thus, the connection security is higher than common wireless communications where the transmission can be detected by many others besides the desired receiver, and/or
9. better looking compared with a metal cable connector and may not be visible.

In a first specific aspect there is provided an electromagnetic coupler comprising a transmitter configured to operate at a first central frequency, a first termination configured to connect to the transmitter and having a second resonant frequency, a receiver configured to operate at the first frequency, a second termination configured to connect to the receiver and having a third resonant frequency, wherein when the first and second terminations are bought into close proximity when engaged, the equivalent resonant frequency is substantially the first central frequency, and wherein the second and/or third resonant frequencies are substantially spectrally spaced from the first central frequency.

BRIEF DESCRIPTION OF DRAWINGS

One or more example embodiments will now be described, with reference to the following figures, in which.

DETAILED DESCRIPTION

Figure 1:
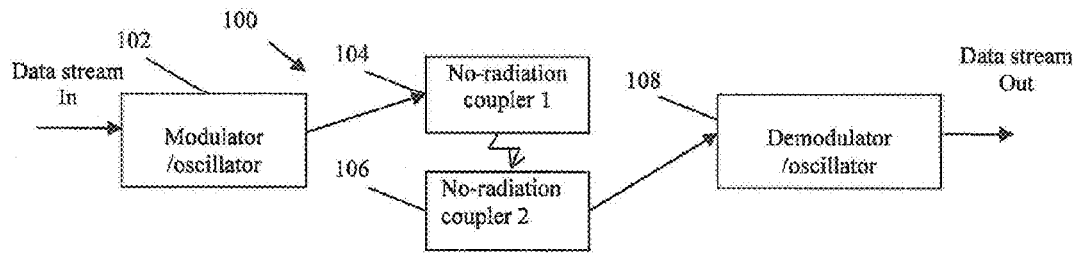
FIG. 1 is a schematic of a dielectric connector according to a first embodiment.

A dielectric coupler 100 is illustrated in FIG. 1 according to the first embodiment. A data stream to be transmitted first may be up/down converted to a millimeter wave (MMW) frequency by modulator 102. The signal from the modulator 102 passes to a transmitter (Tx) side termination 104, which is engaged with a receiver (Rx) side termination 106, whereby the signal will be transmitted via RF from one to the other. The signal passes from the Rx termination to a demodulator 108 for down/up conversion.

When the two terminations 104, 106 are disconnected, the signal will be reflected back instead of radiated into the atmosphere. When two terminations 104, 106 are connected, the couplers have just dielectric touching and the signal is transferred without any significant leakage. So whether the coupler is connected or not, there is no external RF signal radiation and the leakage may be insignificant.

Figure 2:
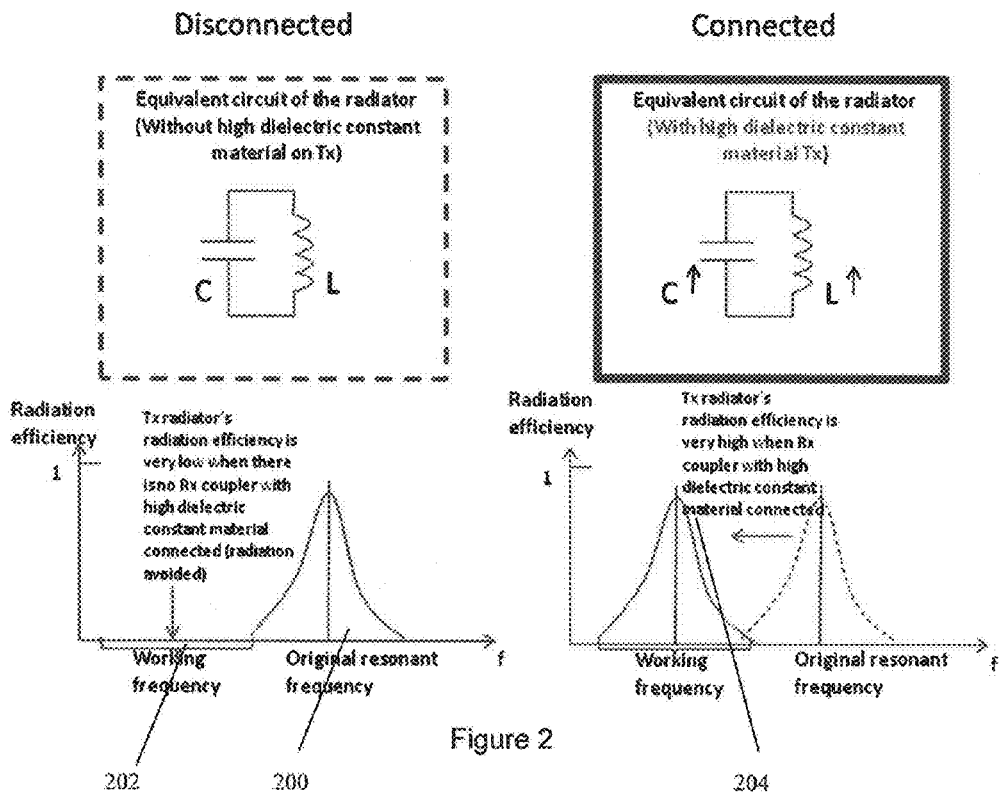
FIG. 2(a) is an equivalent resonance circuit diagram and graph of frequency response of the dielectric connector in a disconnected state.
FIG. 2(b) is an equivalent resonance circuit diagram and graph of frequency response of the dielectric connector in a connected state.

The coupler is based on a resonant frequency shifting principle, which is illustrated in FIG. 2(a) and FIG. 2(b). When the connector is "disconnected", the Tx termination 104 has an original resonant frequency 200 which is higher than the working frequency 202 of the MMW modulator 102, as a result, the Tx termination 104 impedance is significantly mismatched with respect to the Rx termination 106 and hence the RF power is transferred externally as shown in FIG. 2(a). Therefore, equivalent capacitance of the resonance circuit 206 does not increase and hence the radiation efficiency is very low when there is no high dielectric material connected to the Tx termination 104 as shown in FIG. 2(a). However, when the connector is "connected", a high dielectric constant material sheet is sandwiched between Tx and Rx terminations 104, 106 as shown in FIG. 2(b). This high dielectric constant sheet material will increase the equivalent capacitance of the resonance circuit 208 of the terminations 104, 106 as shown in FIG. 2(b). Hence the resonance frequency 204 is reduced. By carefully designing the structure size in terms of the material dielectric constant, the connected state will may have a resonant frequency equal to the working central frequency of the Tx and Rx as shown in FIG. 2(b). Thus, the coupler will pass the signal when the terminations are engaged. If the gap between Tx and Rx is very small, almost all signal power is transmitted from Tx to Rx, except for the material loss. The radiation leakage is small.

Figure 3:
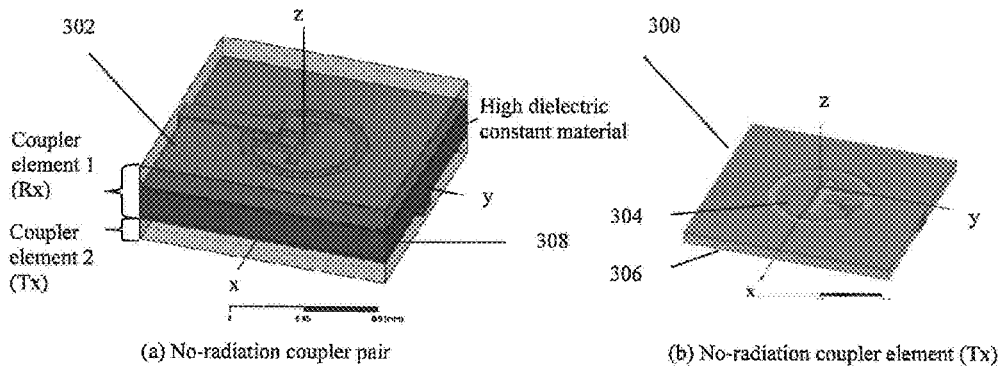
FIG. 3(a) is a perspective view of a dielectric coupler pair according to a second embodiment.
FIG. 3(b) is a perspective view of a Tx termination according to the second embodiment.

FIG. 3(a) shows a dielectric coupler according to the second embodiment. It includes a Tx termination 300 and a Rx termination 302. The Tx termination 300 is shown in FIG. 3(b). The arrangement of the dielectric coupler of FIG. 3(a) and the Tx termination of FIG. 3(b) is shown with respect to the rectangular coordinates x, y, z. The Tx termination 300 includes a substrate 304 and antenna 306 without a high dielectric constant material plane as shown in FIG. 3(b). The Rx termination 302 has almost the same structure as the Tx termination 300 except a high dielectric constant plane 308 is attached as shown in FIG. 3(a).

The Tx termination 300 is made on PCB material (e.g., FR408). In FIG. 3(b), the Tx termination 300 includes metal parts exposed (top layer). However, the Tx termination 300 can be covered by another non-metal film (e.g., polytetrafluroethylene, commonly known as TEFLON®). The dielectric constant of this nonmetal film should be very different as compared with the high dielectric constant material on the Rx termination 302 as shown in FIG. 3(a). The backing substrate is FR408. Other low dielectric constant PCB substrate materials can also be used. For 60 GHz working frequency, the design dimensions of the antenna 306 may be: loop diameter 1 mm, slot width 0.075 mm, patch inside dipole 0.38 mm×0.15 mm, and dipole width 0.6 mm. The coupler is fed by a micro-strip line to the centre of the metal patch from the back of the PCB.

Figure 4:
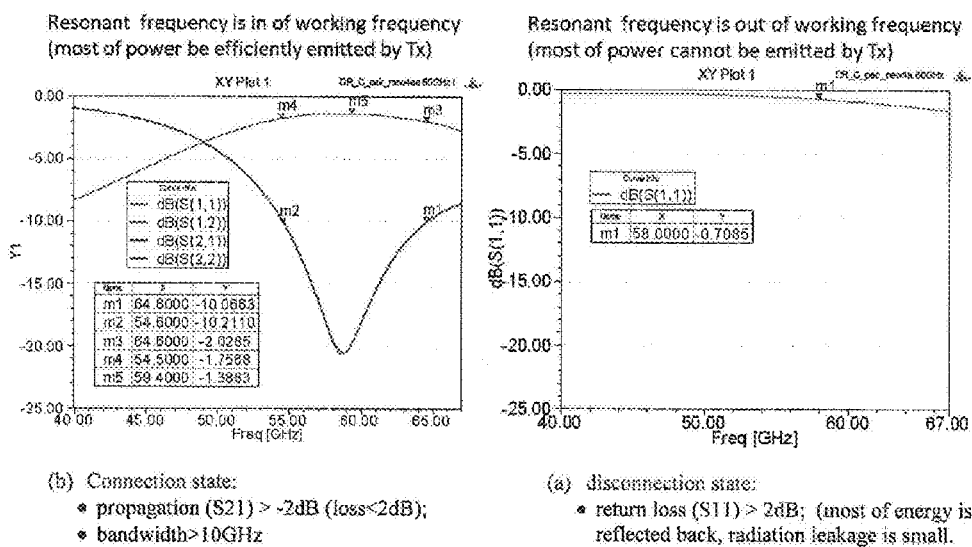
FIG. 4(a) is a frequency response graph of the second embodiment in a connection state.
FIG. 4(b) is a frequency response graph of the second embodiment in a disconnection state.

The coupler performance according to the second embodiment is shown in FIG. 4(a) and FIG. 4(b). The central frequency is 58 GHz. In the connected state (FIG. 4 (a)), the propagation (S21) is high at the central frequency and −3 dB bandwidth is >15 GHz. The impedance matching frequency bandwidth (S11<−10 dB) is 10 GHz. The wide impedance bandwidth is contributed by the slot loop plus slot dipole structure of the antenna 306 shown in FIG. 3(b). By carefully designing the centre frequencies for the slot loop and slot dipole structure of the antenna 306 shown in FIG. 3(b), the bandwidth may be maximised.

The slot loop and slot dipole structure of the antenna 306 shown in FIG. 3(b) may be used to enlarge the bandwidth by locating two resonant frequencies close to each other so that the corresponding pass-bands are partially overlaid as shown in FIG. 4(a). This will result in a wider bandwidth. Two resonant frequencies are controlled by the slot loop and slot dipole structure of the antenna 306 shown in FIG. 3(b), respectively. For example, by increasing the slot loop diameter of the antenna 306, one of the resonant frequencies is reduced, while by shortening the length of the slot dipole of the antenna 306, the other resonant frequency is increased.

The propagation loss is 1.38 dB at the central frequency in the connected state as shown in FIG. 4(a). That means more than 70% of the energy may be transferred from Tx to Rx. The remainder is mainly material losses, and a small part is radiation leakage. In the disconnected state (FIG. 4(b)), the return loss is small (0.7 dB). Thus, most of the energy (85%) is reflected back to the Tx instead of radiated to air.

A coupler may be modified by designing the bandwidth (e.g., 10 GHz), dielectric constant material (e.g., −11) and radiation leakage rate according to the requirements of a given application.

To further reduce any RF leakage, an absorber may surround the terminations. The absorber should have small effect to coupler parameters. Thus, less dielectric constant absorber foam or rubber is preferred. The absorbing rate should be as high as possible.

The dielectric connector can be modified according to the requirements of a given application. Three examples are introduced below.

Figure 5:
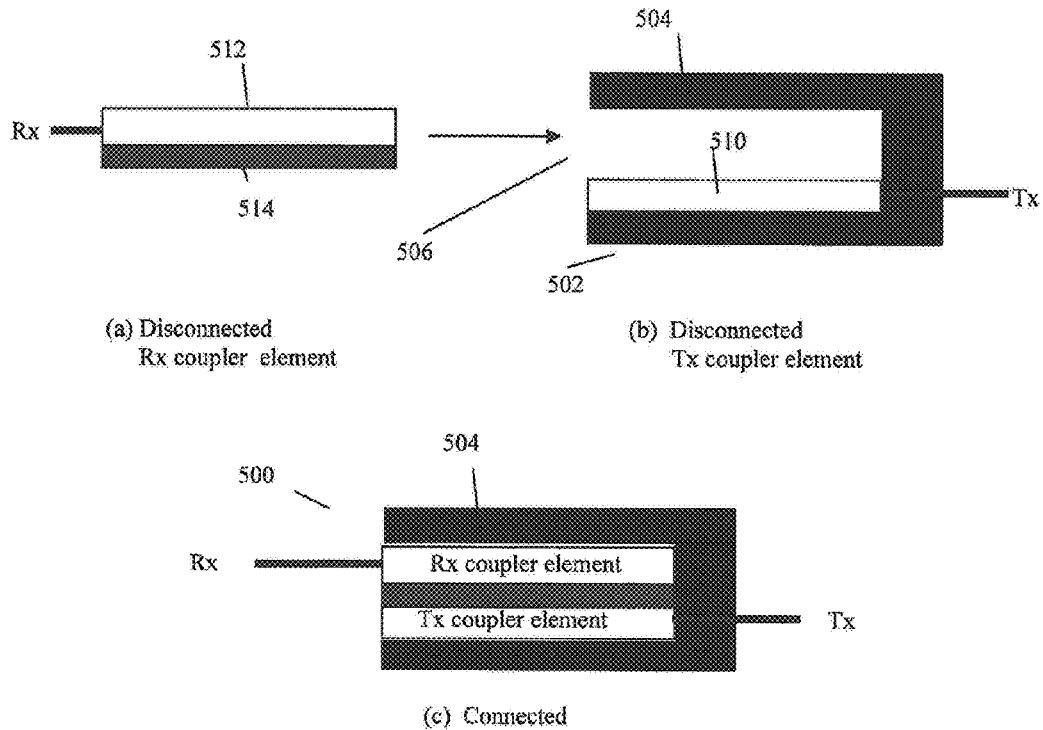
FIG. 5(a) is a cross section of an inserting type Rx termination in a disconnected state according to a third embodiment.
FIG. 5(b) is a cross section of an inserting type Tx termination in a disconnected state according to the third embodiment.
FIG. 5(c) is a cross section of an inserting type connector in a connected state according to the third embodiment.

FIGS. 5(a), 5(b) and 5(c) show an inserting type coupler 500. In FIG. 5(b), the Tx termination 502 includes a surround structure 504 with a slot opening 506 and the surround structure 504 is an absorber. In the disconnected state, the small radiation leakage from the Tx element 510 is absorbed by the absorber 504. In FIG. 5(a), the Rx termination 512 includes a high dielectric constant material 514. In the connected state, shown in FIG. 5(c), the Rx termination 512 shown in FIG. 5(a) is inserted in the slot opening 506 shown in FIG. 5(b), then the signal is transmitted from Tx to Rx through high dielectric material 514. The small radiation leakage in connected state is also further absorbed by the absorber 504.

Figure 6:
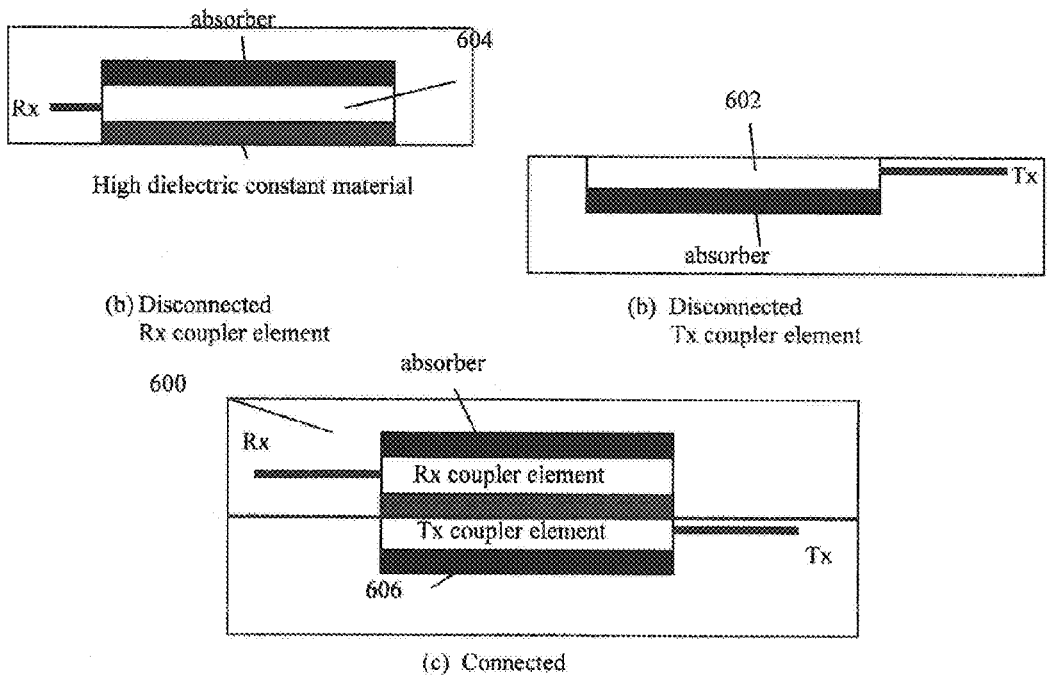
FIG. 6(a) is a cross section of a touching type Rx termination in a disconnected state according to a fourth embodiment.
FIG. 6(b) is a cross section of a touching type Tx termination in a disconnected state according to the fourth embodiment.
FIG. 6(c) is a cross section of a touching type connector in a connected state according to the fourth embodiment.

FIG. 6(c) shows a touching type coupler 600. The Tx termination 602 and Rx termination 604 face each other. To maximise the terminations alignment, some self-alignment structure is needed. For example, with a central working frequency of 60 GHz and the dielectric constant of 10.2, then the mechanical tolerance is about ±0.1 mm to ensure good coupling. There are many kinds of self-alignment systems that can be used, such as magnetic or embossing. An absorber 606 placed under the Tx termination to further reduce the radiation leakage in the connected and disconnected states.

Figure 7:
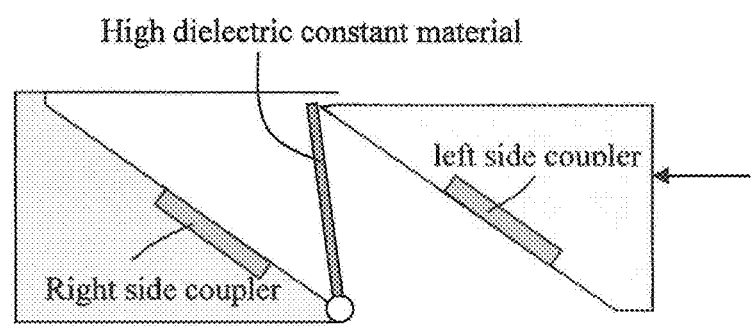
FIG. 7 is a cross section of a two-way connector according to a fifth embodiment.

In the previous embodiments, the Rx resonant frequency may be fixed at the working frequency because the high dielectric constant material is permanently provided on the Rx side. To achieve two-way communications, an individual reverse connector 702 made of high dielectric constant material is provided as shown in FIG. 7. By using the same principle of resonance frequency shifting, frequency shifting for both sides of the individual reverse connector 702 can be achieved. Namely, the Tx can be at right side and/or left side of the following individual reverse connector 702 for two-way communications in single dielectric connector. Here the high dielectric constant material of the individual reverse connector 702 neither touches a right side coupler 704 nor a left side coupler 706 until connected, and thus leakage from either side is prevented in the unconnected state.

While example embodiments have been described in detail, many variations are possible within the scope of the disclosure as will be clear to a skilled reader.

The invention claimed is:
1. An electromagnetic coupler comprising:
a transmitter configured to operate at a first central frequency;
a first termination configured to connect to the transmitter and having a second resonant frequency;

a receiver configured to operate at the first central frequency; and a second termination configured to connect to the receiver and having a third resonant frequency;

wherein the first and second terminations are brought into close proximity when engaged and the second resonant frequency and the third resonant frequency are matched to the first central frequency, and wherein the second resonant frequency and/or the third resonant frequency is spectrally spaced from the first central frequency when the first termination and the second termination are disengaged.

2. The coupler of claim 1, wherein RF (radio frequency) leakage is less than 15%.

3. The coupler of claim 1 further comprising an absorber adjacent to or surrounding the first termination and/or the second termination.

4. The coupler of claim 1, wherein bandwidth of the coupler is greater than 16%.

5. The coupler in claim 1 further comprising a dielectric material between the first termination and the second termination.

6. The coupler of claim 5, wherein the dielectric material is provided on the second termination.

7. The coupler of claim 5, wherein the dielectric material is configured to be spaced from the first termination and the second termination when disengaged and sandwiched between the first termination and the second termination when engaged.

8. The coupler of claim 1, wherein the first termination is configured to insert into the second termination.

9. The coupler of claim 1, wherein the first termination and the second termination are configured to touch when in close proximity.

10. The coupler of claim 1, wherein the first termination and the second termination are arranged in a self-alignment structure.

11. The coupler of claim 1, wherein the first central frequency is a MMW (millimeter wave) frequency.

12. The coupler of claim 1, wherein the first termination and/or the second termination comprise a slot loop and/or slot dipole antenna arrangement.

13. The coupler in claim 12, wherein pass-bands corresponding to the slot loop and slot dipole antenna arrangement are partially overlapping when the first and second terminations are engaged.

14. The coupler of claim 1, wherein the second resonant frequency is greater than two times the first central frequency.

15. The coupler of claim 1, wherein the first termination and/or the second termination comprise a slot loop and/or slot dipole antenna arrangement, and wherein one of the second resonant frequency and the third resonant frequency is reduced by varying a diameter of the slot loop antenna arrangement.

16. The coupler of claim 15, wherein another of the second resonant frequency and the third resonant frequency is increased by varying a length of the slot dipole antenna arrangement.

17. The coupler of claim 1, wherein the first termination and the second termination are arranged in one of: a magnetic self-alignment structure or an embossing self-alignment structure.

18. An electromagnetic coupler comprising:

a transmitter termination having a first resonant frequency; and a receiver termination having a second resonant frequency;

wherein the transmitter termination and the receiver termination are brought into close proximity when engaged, and the first resonant frequency and second resonant frequency are matched to a working central frequency, and wherein the first resonant frequency and/or the second resonant frequency are spectrally spaced from the working central frequency when the transmitter termination and the receiver termination are disengaged.

19. An electromagnetic coupler comprising:

a first termination having a first resonant frequency;

a second termination having a second resonant frequency; and a reverse connector placed between the first termination and the second termination;

wherein the reverse connector is configured to be disconnected from the first termination and the second termination in an unengaged state, and wherein the first resonant frequency and/or the second resonant frequency is spectrally spaced from a working central frequency when the reverse connector is disconnected from the first termination and the second termination.

* * * * *